(12) United States Patent
Dobriyal et al.

(10) Patent No.: US 11,715,928 B2
(45) Date of Patent: Aug. 1, 2023

(54) DECOUPLING LAYER TO REDUCE UNDERFILL STRESS IN SEMICONDUCTOR DEVICES

(71) Applicant: INTEL CORPORATION, Santa Clara, CA (US)

(72) Inventors: Priyanka Dobriyal, Santa Clara, CA (US); Susheel G. Jadhav, Los Gatos, CA (US); Ankur Agrawal, Chandler, AZ (US); Quan A. Tran, Fremont, CA (US); Raiyomand F. Aspandiar, Portland, OR (US); Kenneth M. Brown, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 822 days.

(21) Appl. No.: 16/554,789

(22) Filed: Aug. 29, 2019

(65) Prior Publication Data

US 2021/0066882 A1    Mar. 4, 2021

(51) Int. Cl.
*H01S 5/0234* (2021.01)
*G02F 1/015* (2006.01)
(Continued)

(52) U.S. Cl.
CPC ............ *H01S 5/0234* (2021.01); *G02F 1/015* (2013.01); *H01S 5/0237* (2021.01);
(Continued)

(58) Field of Classification Search
CPC .............. H01S 5/0234; H01S 5/02234; H01S 5/02325; H01S 5/0237; H01S 5/0261; H01S 5/02345; G02F 1/015; H01L 24/00
(Continued)

(56) References Cited

U.S. PATENT DOCUMENTS

| | | |
|---|---|---|
| 5,144,634 A | 9/1992 | Gasser et al. |
| 6,369,451 B2 * | 4/2002 | Lin ...................... B23K 3/0623 257/E21.511 |

(Continued)

OTHER PUBLICATIONS

D.M. Pepper et al., "Inspection of Flip-Chip Epoxy Underfill in Microelectronic Assemblies Using Compensated Laser-Based Ultrasonic Receivers", Review of Progress in Quantitative Nondestructive Evaluation, 1998, pp. 1943-1950, vol. 17.

(Continued)

*Primary Examiner* — Vu A Vu
(74) *Attorney, Agent, or Firm* — Schwabe, Williams & Wyatt, P.C.

(57) ABSTRACT

An integrated circuit assembly includes a support (e.g., package substrate or circuit board) and a semiconductor die including a device. The semiconductor die is mounted to the support with the device facing the support. The device can be, for example, a quantum well laser device or a photonics device. A layer of decoupling material is on the device. An underfill material is between the semiconductor die and the support, where the decoupling material is between the device and the underfill material. The decoupling layer decouples stress from transferring from the underfill material into the device. For example, the decoupling material forms only weak bonds with the underfill material and/or a passivation layer on the device, in an embodiment. Weak bonds include non-covalent bonds and non-ionic bonds, for example. The decoupling material can be, for instance, a PTFE film, a poly(p-xylylene) film, a fluorocarbon, or a compound lacking free hydroxyl groups.

20 Claims, 7 Drawing Sheets

(51) Int. Cl.
*H01S 5/0237* (2021.01)
*H01S 5/02234* (2021.01)
*H01S 5/02325* (2021.01)
*H01S 5/026* (2006.01)

(52) U.S. Cl.
CPC ...... *H01S 5/02234* (2021.01); *H01S 5/02325* (2021.01); *H01S 5/0261* (2013.01)

(58) Field of Classification Search
USPC ........................................................ 372/44.01
See application file for complete search history.

(56) References Cited

U.S. PATENT DOCUMENTS

| | | | | |
|---|---|---|---|---|
| 6,396,082 B1* | 5/2002 | Fukasawa | ............. | H01L 33/486 |
| | | | | 257/E33.059 |
| 6,436,331 B1* | 8/2002 | Kuno | ................... | H01L 21/563 |
| | | | | 264/102 |
| 6,571,466 B1* | 6/2003 | Glenn | ................ | H01L 31/0203 |
| | | | | 29/841 |
| 6,636,538 B1 | 10/2003 | Stephens | | |
| 6,674,159 B1* | 1/2004 | Peterson | ........... | H01L 27/14618 |
| | | | | 257/434 |
| 7,109,061 B2* | 9/2006 | Crane | .................. | H01L 23/293 |
| | | | | 257/E21.503 |
| 7,213,739 B2* | 5/2007 | Wilson | ................... | H01L 24/13 |
| | | | | 257/E23.021 |
| 7,239,767 B2* | 7/2007 | Kim | ........................ | G02B 6/42 |
| | | | | 385/32 |
| 7,443,038 B2* | 10/2008 | Kinsman | .......... | H01L 27/14634 |
| | | | | 257/772 |
| 7,471,282 B2* | 12/2008 | Lin | ...................... | G06F 3/03543 |
| | | | | 345/166 |
| 7,656,042 B2* | 2/2010 | Lii | ......................... | H01L 21/563 |
| | | | | 257/E21.503 |
| 7,829,992 B2* | 11/2010 | Sugino | .................. | H01L 25/105 |
| | | | | 257/737 |
| 7,843,074 B2 | 11/2010 | Gao et al. | | |
| 8,158,888 B2* | 4/2012 | Shen | ................... | H01L 23/3128 |
| | | | | 174/255 |
| 8,357,565 B2* | 1/2013 | Ofner | .................... | H01L 21/563 |
| | | | | 257/E21.503 |
| 8,759,865 B2 | 6/2014 | Tsai et al. | | |
| 9,627,346 B2* | 4/2017 | Hsu | ..................... | H01L 23/3128 |
| 9,761,542 B1* | 9/2017 | Sylvestre | ................ | H01L 23/13 |
| 9,837,292 B2* | 12/2017 | Chuang | ............. | H01L 21/67126 |
| 2002/0127771 A1* | 9/2002 | Akram | ................ | H01L 25/0657 |
| | | | | 438/107 |
| 2009/0180732 A1* | 7/2009 | Takai | ....................... | G02B 6/42 |
| | | | | 264/1.7 |

OTHER PUBLICATIONS

"Laser Diode", Wikipedia, retrieved online at <URL: https://en.wikipedia.org/w/index.php?title=Laser_diode&oldid=899844307>, Last edited Jun. 1, 2019, 15 pages.

"Parylene", Wikipedia, retrieved online at <URL: https://en.wikipedia.org/w/index.php?title=Parylene&oldid=897678965>, Last edited May 18, 2019, 12 pages.

"Silicon Photonics", Wikipedia, retrieved online at <URL: https://en.wikipedia.org/w/index.php?title=Silicon_photonics&oldid=890173721>, Last edited Mar. 30, 2019, 13 pages.

* cited by examiner

DECOUPLING LAYER TO REDUCE UNDERFILL STRESS IN SEMICONDUCTOR DEVICES

BACKGROUND

A variety of integrated circuit devices emit, transmit, detect, and/or process light and other forms of radiant energy. The laser diode is one such semiconductor device that uses a p-i-n diode to convert electrical energy into light. In some such devices, applied voltage drives electrons and holes from the n-region and the p-region into the intrinsic (i) region where electrons combine with holes. In doing so, the electrons change from a higher energy state to a lower energy state and emit a photon of light. The emission can be stimulated to generate light with the same phase, coherence, and wavelength. The choice of semiconductor material determines the wavelength of the emitted light, which can range from infrared (e.g., a wavelength greater than ~700 nm) to the UV spectrum (e.g., a wavelength less than ~400 nm), for example. The laser diode is used in a variety of computing and data processing systems.

Figure 1:
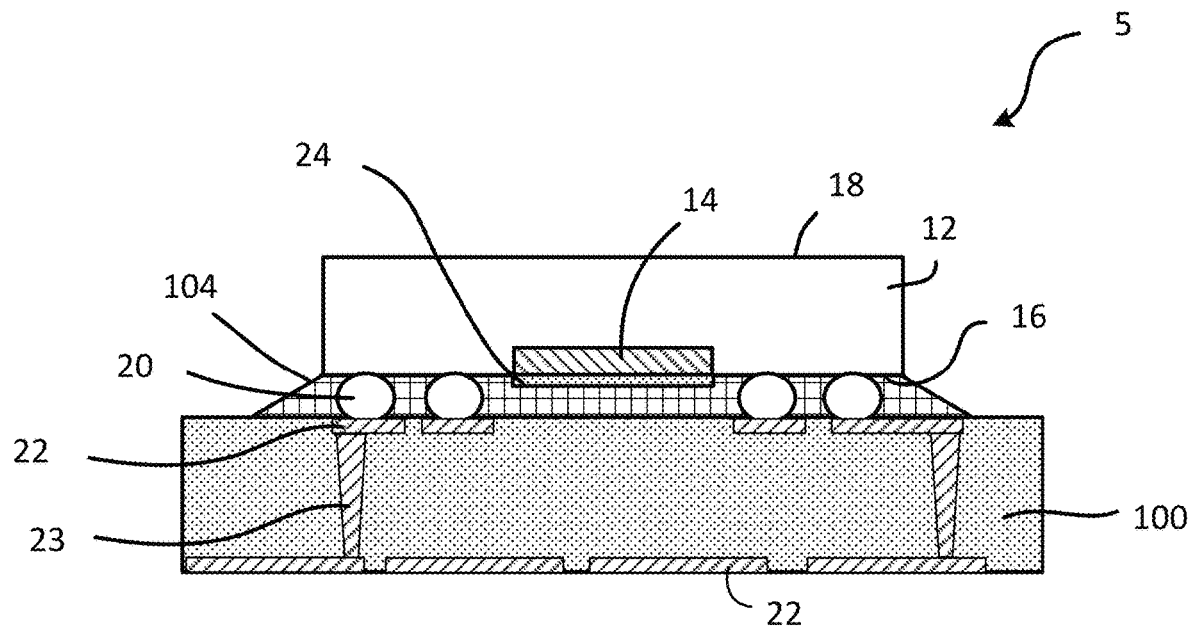
FIG. 1 is a cross-sectional view of an integrated circuit package or assembly, in accordance with an embodiment of the present disclosure.

The figures depict various embodiments of the present disclosure for purposes of illustration only. Numerous variations, configurations, and other embodiments will be apparent from the following detailed discussion.

DETAILED DESCRIPTION

Techniques are disclosed for reducing stress imparted to a device area of a semiconductor chip mounted to a support substrate. The techniques are particularly well-suited for reducing stress that causes laser performance and reliability failures for circuitry that includes one or more laser devices, but can be used with any number of integrated circuit devices, as will be appreciated in light of this disclosure. In accordance with one example embodiment, an integrated circuit (IC) device includes a support and a semiconductor die. The support can be a package substrate or printed circuit board, for example. The die has one or more devices on the first surface in addition to contact pads as needed. For example, the die includes a laser diode fabricated on a semiconductor base of gallium arsenide, silicon, or other suitable semiconductor material. The semiconductor die is mounted to the support with the device facing the support. A layer of decoupling material is on the device and generally absent from other regions of the die. For example, the decoupling material is applied as a relatively thin layer (e.g., 1-15 µm) on a passivation oxide layer of the device. In most situations, the decoupling material will cover the entire area of the device and optionally may extend slightly beyond the boundary of the device. An underfill material is between the semiconductor die and the support, wherein the decoupling material is between the device and the underfill material. The underfill material forms chemical bonds with the semiconductor die, except for areas coated with the decoupling material. The decoupling material functions to decouple stress on the active layer(s) of the device by simulating a non-contact condition with the underfill material. For example, the decoupling material is a polytetrafluoroethylene (PTFE) film, a film of poly(p-xylylene), a fluorocarbon, or some other compound lacking free hydroxyl groups, according to some such embodiments. Since the decoupling materials have a chemical structure that forms only weak bonds with the device and/or underfill material (e.g., non-covalent bonds and non-ionic bonds, such as van der Waals bonds), stress normally associated with shrinking or thermal changes to the underfill material is not transferred (at least in significant amount) to the device. The result is a more consistent, more reliable device.

Another example embodiment includes a method of assembling a semiconductor die in an integrated circuit package that results in reduced stress imparted on a device on the die. In accordance with one such embodiment, the method includes providing an integrated circuit die including a device and contact pads on a first side, masking the first side of the die and leaving the device exposed, and coating the device with a decoupling material. After removing the mask, solder balls are deposited onto contact pads metallized onto the surface of the die. In other embodiments, the solder balls can be deposited onto contact pads prior to selectively applying the decoupling material to desired regions of the die. The die is then mounted to a support substrate (e.g., package or circuit board) with electrical connections (e.g., solder) between the die and the support. An underfill material can be applied between the support substrate and the die so that the solder is at least partially encapsulated in the underfill material and the decoupling material is between the device and the underfill material. Again, since the decoupling materials have a chemical structure that forms only weak bonds with the device being decoupled and/or the underfill material (e.g., non-covalent bonds and non-ionic bonds, such as van der Waals bonds), stress normally associated with shrinking or thermal changes to the underfill material is not transferred (at least in significant amount) to the device. The methodology is particularly suited to forming, for example, silicon photonics, laser diodes, light emitting diodes, optical modulators, and other devices having a demand for high reliability laser performance. Numerous variations and embodiments will be apparent in light of the present disclosure.

General Overview

Flip-chip bonding is a method of mounting semiconductor chips in a face-down orientation to a support surface, such as a circuit board or package substrate. For example, after fabricating integrated circuits on the wafer, contact pads on the surface of the chips are metallized. Solder balls are deposited onto the metallized contact pads and the chips are cut and liberated. A chip is then flipped and positioned so that the solder balls contact the corresponding contact pads on the package substrate. The solder is heated to reflow the solder, which results in a solid electrical and physical connection to the support surface. An underfill material, such as an epoxy resin or the like, can be injected or otherwise applied between the chip and the substrate. The underfill material generally provides mechanical support to the chip and enhances heat transfer between the chip and the substrate. The underfill material typically forms a chemical bond with the chip and with the support surface, whether a package substrate or circuit board. Although the underfill can effectively stabilize the chip, the underfill can also impart mechanical strain to the chip and devices on the chip when the underfill material cures. For example, cross-linking bonds are formed during curing that result in shrinking of the underfill material. When the underfill is bonded to the surface of the light-emitting device (e.g., a laser diode), underfill shrinking can impart mechanical stress to the quantum well layer, which affects the performance and reliability of the device and ultimately causes failure. Differences in coefficients of thermal expansion between the semiconductor material and the underfill material can cause additional stress. One approach to address mechanical and thermal stress has been to first mount a semiconductor die to a ceramic substrate, and then mount the ceramic substrate to the support (e.g., a printed circuit board). The ceramic sub-mount is a rigid material that can withstand the mechanical stress caused by thermal expansion and changes to the underfill material. As a result, the sub-mount avoids transferring stress to the laser diode. However, such an approach is ill-suited for flip-chip bonding approaches where the laser is mounted face-down. In another approach, the chip is mounted so that underfill is not present in the region of the device. However, such an approach limits the available packaging solutions and reduces the possibility of advanced 3D integration with changing future needs. As a result of the continual demands for improved performance and reliability in such devices, a need exists for advances in chip packaging. The present disclosure addresses this need and others.

In accordance with one embodiment of the present disclosure, an integrated circuit assembly includes a chip with at least one device on a first (front) face. The device(s) may include a laser diode or optical modulator, for example. The chip is mounted with the first face against a circuit board or package substrate using solder connections between the chip and the substrate. A layer of decoupling material coats the surface of the device(s) on the chip. The decoupling material is generally selected to have a chemical structure that forms only weak bonds to the underfill material and/or the device (e.g., non-covalent bonds and non-ionic bonds, such as van der Waals bonds) and to be mechanically compliant to the device surface or compliant to one or both the device and to the underfill material. Example decoupling materials include a fluorocarbon or polytetrafluoroethylene (PTFE) film. When underfill is subsequently applied between the chip and the substrate, the decoupling material is between the device and the underfill material and therefore prevents the underfill from bonding to the device. As a result, mechanical stress imparted to the device attributed to changes in the underfill material is eliminated or reduced compared to existing mounting techniques.

Methodologies of the present disclosure can apply generally to integrated circuit chips, where a layer of intervening material is positioned between one or more device portions of a chip and the underlying support (e.g., package or circuit board) such that the intervening material decouples the device area of the chip from the support. Numerous variations and embodiments will be apparent in light of the present disclosure.

As discussed herein, terms referencing direction, such as upward, downward, vertical, horizontal, left, right, front, back, etc., are used for convenience to describe a package substrate oriented in a horizontal plane. Embodiments of the present disclosure are not limited by these directional references and it is contemplated that substrates and related assemblies of the present disclosure could be used in any orientation.

Note that decoupling material generally refers to materials that have a chemical structure that forms only weak bonds with a given underfill material and/or a given device layer. Weak bonds refer to non-covalent bonds and non-ionic bonds, such as van der Waals bonds or van der Waals interactions. So, in some embodiments, decoupling material is a material that precludes covalent bonding and ionic bonding with the given underfill material and/or the device layer, or otherwise remains compliant with respect to the underfill material and/or the device layer. Covalent bonds are stronger than ionic bonds, but both are relatively strong bonds, as compared to relatively weaker van der Waals bonds. Further note that materials described as being "compositionally different" or "compositionally distinct" as used herein refers to two materials that have different chemical compositions. This compositional difference may be, for instance, by virtue of an element that is in one material but not the other (e.g., polyimide is compositionally different from polyester), or by way of one material having all the same elements as a second material but at least one of those elements is intentionally provided at a different concentration in one material relative to the other material (e.g., an epoxy with 40 wt. % silica filler is compositionally different from an epoxy with 25 wt. % silica filler). In addition to such chemical composition diversity, the materials may also have distinct fillers (e.g., silica or alumina) or the same filler material but at differing concentrations or different particle sizes.

Use of the techniques and structures provided herein may be detectable using tools such as optical microscopy; high resolution physical or chemical analysis; chemical characterization, such as x-ray crystallography or diffraction (XRD), energy-dispersive x-ray spectroscopy (EDX), or Fourier Transform Infrared Spectroscopy (FTIR); scanning/transmission electron microscopy (SEM/TEM), scanning transmission electron microscopy (STEM), nano-beam electron diffraction (NBD or NBED), and reflection electron microscopy (REM); composition mapping; secondary ion mass spectrometry (SIMS); time-of-flight SIMS (ToF-SIMS); local electrode atom probe (LEAP) techniques; and 3D tomography, to name a few suitable example analytical tools. In particular, in some embodiments, an SEM/EDX can show the presence of a decoupling material between the device and the underfill material, according to some embodiments. In other cases, FTIR can be used to detect the layer of decoupling material. Additionally, a cross-sectional analysis may reveal the presence of the decoupling material on the device surface, according to some embodiments.

Integrated Circuit Assembly

FIG. 1 illustrates a cross-sectional view of an integrated circuit package or assembly 5 that includes a chip 10 mounted to a support 100. In some embodiments, the support 100 is a printed circuit board, such as a mother board, daughter board, processor card, memory card, or other computing circuit board. In other embodiments, the support 100 is a package substrate, such as a substrate of polymeric or ceramic materials. In some embodiments, the support 100 is electrically insulating and merely provides structural support to the chip 10. In other embodiments, the support 100 can include conductive structures, such as one or more layers of conductive material (e.g., copper foil) that is patterned to define contact pads 22, conductive traces, interconnect, and the like. In some such embodiments, the support 100 includes a plurality of layers of conductive material connected by vias 23. Numerous variations and embodiments will be apparent in light of the present disclosure.

The chip 10 includes at least one device 14 formed on or in a substrate 12 of semiconductor material, such as silicon (Si), silicon germanium (SiGe), silicon carbide (SiC), gallium arsenide (GaAs), or other suitable material. Example devices 14 include, but are not limited to, a laser diode, an optical modulator, a light emitting diode, or any other device or combination of devices. In this example, the device 14 is on the first face 16 of the chip 10, which optionally includes other devices and structures of an integrated circuit, such as transistors, diodes, and capacitors, to name a few examples. The first face 16 has been oriented so that the device 14 faces the support 100. Such orientation may be referred to as a face-down orientation or flip-chip orientation.

Electrical connectors 20 (e.g., solder balls) make contact between the chip 10 and the support 100 to electrically connect and attach the chip 10 to the support 100, as will be appreciated. Underfill material 104, such as an epoxy resin, occupies the gap between the support 100 and the chip 10 and at least partially encapsulates the electrical connectors 20.

A layer of decoupling material 24 is between the device 14 and the decoupling material 24. In accordance with one embodiment, the decoupling material 24 is selected to have a chemical structure such that it forms only weak bonds (e.g., van der Waals bonds) with the surface of the device 14 (e.g., a passivation oxide layer). The decoupling material 24 functions to decouple the underfill material 104 from the device 14 and allow relative movement of these surfaces as a result of the weak bonding. For example, the decoupling material 24 lacks terminal hydroxyl groups that may result in strong chemical bonds (e.g., covalent bonds) with the device 14 surface. As such, the decoupling material 24 simulates an airgap or non-contact condition at the device 14 surface. Unlike known approaches in which underfill material 104 forms chemical bonds with the device 14, the decoupling material 24 prevents such contact and bonding. Curing, thermal expansion/contraction, and other events that may change the size or shape of the underfill material 104 does not impart stress to the device 14, and in turn improves the performance or reliability of the device 14.

In some embodiments, the decoupling material 24 is a uniform coating with a thickness from 1-15 µm, such as 2-10 µm or 2-3 µm. In some embodiments, the decoupling material 24 covers the entire area of the device 14 and may extend beyond the limits of the device. In other embodiments, an acceptable small portion of the device 14 may remain uncovered by the decoupling material 24 due, for example, to processing defects or other failure of the material to completely cover the device 14. In some such embodiments, at least 90%, at least 95%, at least 98%, or at least 99% of the device area is covered by the decoupling material 24.

Examples of the decoupling material 24 include, but are not limited to, polytetrafluoroethylene (PTFE) and poly(p-xylylene). One such PTFE coating is a dry film aerosol lubricant manufactured by DuPont. Poly(p-xylylene) is sold under the tradename Parylene, with variants having similar chemical structure are sold as Parylene C, Parylene N, Parylene AF-4, Parylene VT-4, Parylene XD, and Parylene F. Other fluorocarbon compounds and compounds lacking terminal hydroxyl groups can be used. In some embodiments, the decoupling material 24 is a material that cures via exposure to air and does not require additional post-deposition processing (e.g., heating, UV light exposure) to stabilize the material. In some embodiments, the decoupling material 24 can be deposited at room temperature using a spray deposition or spin coating technique. Numerous variations and embodiments will be apparent in light of the present disclosure.

Figure 2:
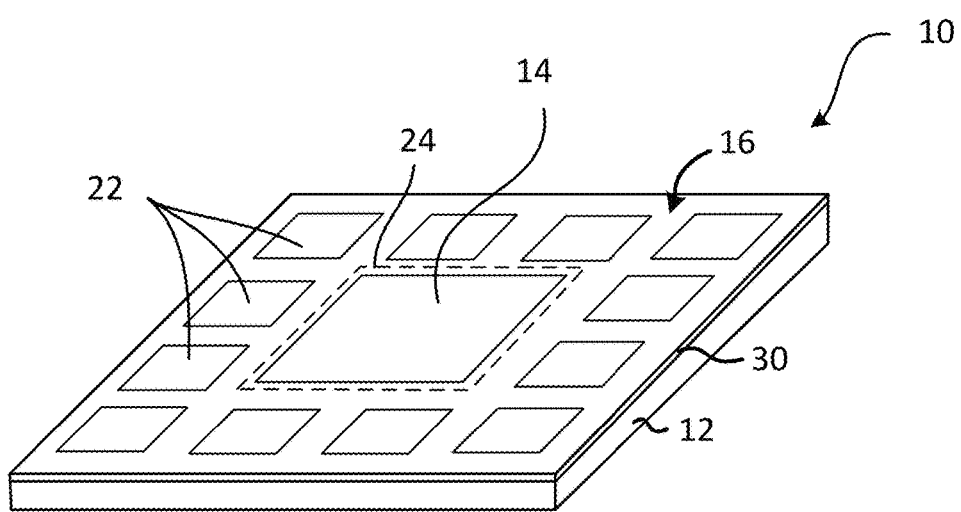
FIG. 2 is a perspective view showing an example of an integrated circuit chip that includes a device and contact pads on a first surface of the chip, in accordance with an embodiment of the present disclosure.

Referring now to FIG. 2, a perspective view shows the first face 16 of a chip 10 that includes a device 14 on a substrate 12 of semiconductor material and a plurality of metallized contact pads 22 positioned around the outside of the device 14, in accordance with an embodiment of the present disclosure. The contact pads 22 are exposed as needed for subsequent bonding, metallization, and other processing. A layer of decoupling material 24, represented by a broken line surrounding and defining an area slightly larger than the device 14, is on the device 14 and completely covers the entire area of the device 14. For example, the decoupling material 24 contacts a layer of passivation material on top of semiconductor material layers of a laser diode. The chip 10 includes an insulating dielectric 30 that may be coplanar with the top surfaces of the contact pads 22 and device 14, but such planar surface condition is not required, as will be appreciated. In some cases, the top surface of the device 14 may have a different elevation compared to the top surfaces of metallized contact pads 22 or neighboring areas. In other embodiments, the top surface of the device 14 is defined by a passivation layer, interlayer dielectric, or other material that defines a planar or generally planar surface with contact pads 22. Although only one device 14 is shown in FIG. 2, the chip 10 may include more than one device 14 and more or fewer contact pads 22 may be present.

Figure 3:
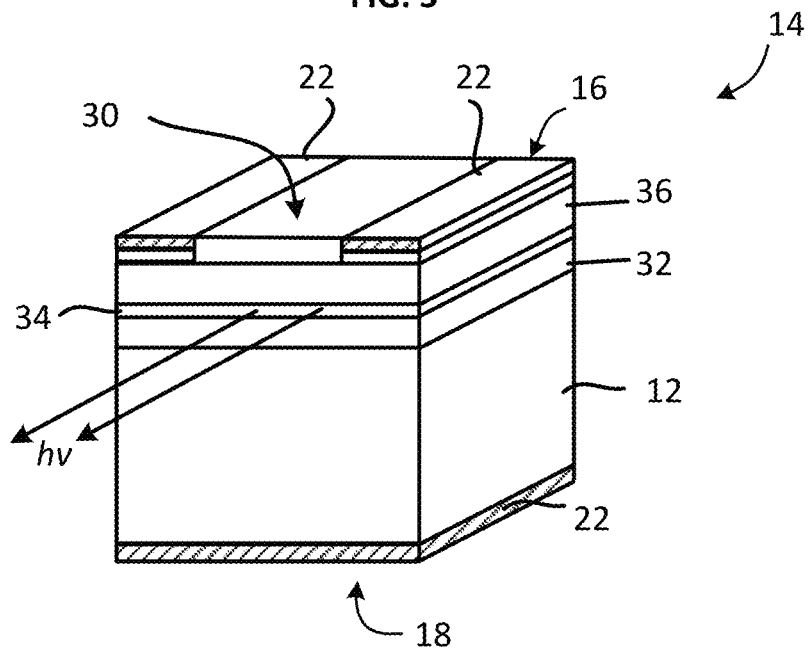
FIG. 3 is a perspective view showing an example structure for a side-emitting laser diode, in accordance with an embodiment of the present disclosure.
Figure 4:
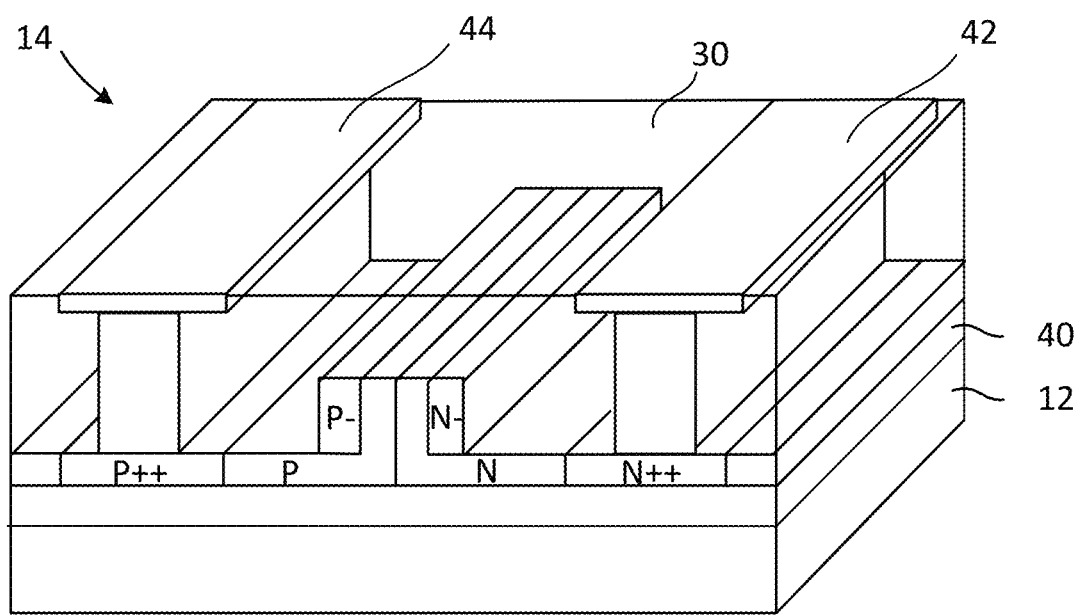
FIG. 4 is a perspective view showing an example structure for an optical modulator, in accordance with an embodiment of the present disclosure.

FIGS. 3 and 4 illustrate perspective views of example device 14 structures, in accordance with some embodiments. In FIG. 3, the device 14 is a side-emitting laser diode in a face-up orientation. The laser diode includes a substrate 12 of semiconductor material, such as n-type silicon or gallium arsenide. Device layers on the substrate 12 include an active material layer or quantum well 34 between an n-type reflector 32 and p-type reflector 36. An insulating dielectric 30 or passivation oxide is on top of the device layers. Contacts 38 are on the p-type reflector 36 as well as on the bottom or second face 18 of the substrate 12. The surface of the contacts 38 is coplanar with the surface of the insulating dielectric 30. Light hv is emitted from the side of the quantum well 34 during operation.

FIG. 4 illustrates a device 14 configured as a silicon optical modulator, in accordance with an embodiment of the present disclosure. The optical modulator includes an oxide layer 40 (e.g., $SiO_2$) on a silicon substrate 12. On the oxide layer 40 is a first device portion that includes regions of heavily doped n-type semiconductor material (n++), n-type semiconductor material (n), and lightly doped n-type semiconductor material (n−). The second device portion includes regions of heavily doped p-type semiconductor material (p++), p-type semiconductor material (p), and lightly doped p-type semiconductor material 44 (p−). The n-type region (n) defines an interface with the lightly doped n-type material (n−) and also with the p-type semiconductor material (p). The p-type material (p) defines a junction with the lightly doped p-type material (p−) and with the n-type material (n). A signal contact 42 makes contact with the heavily doped n-type material (n++) and a ground contact 44 makes contact with the heavily doped p-type material (p++). An insulating dielectric 30 fills regions between the structures and is coplanar with top surfaces of the signal contact 42 and the ground contact 44.

Methodology

Figure 5:
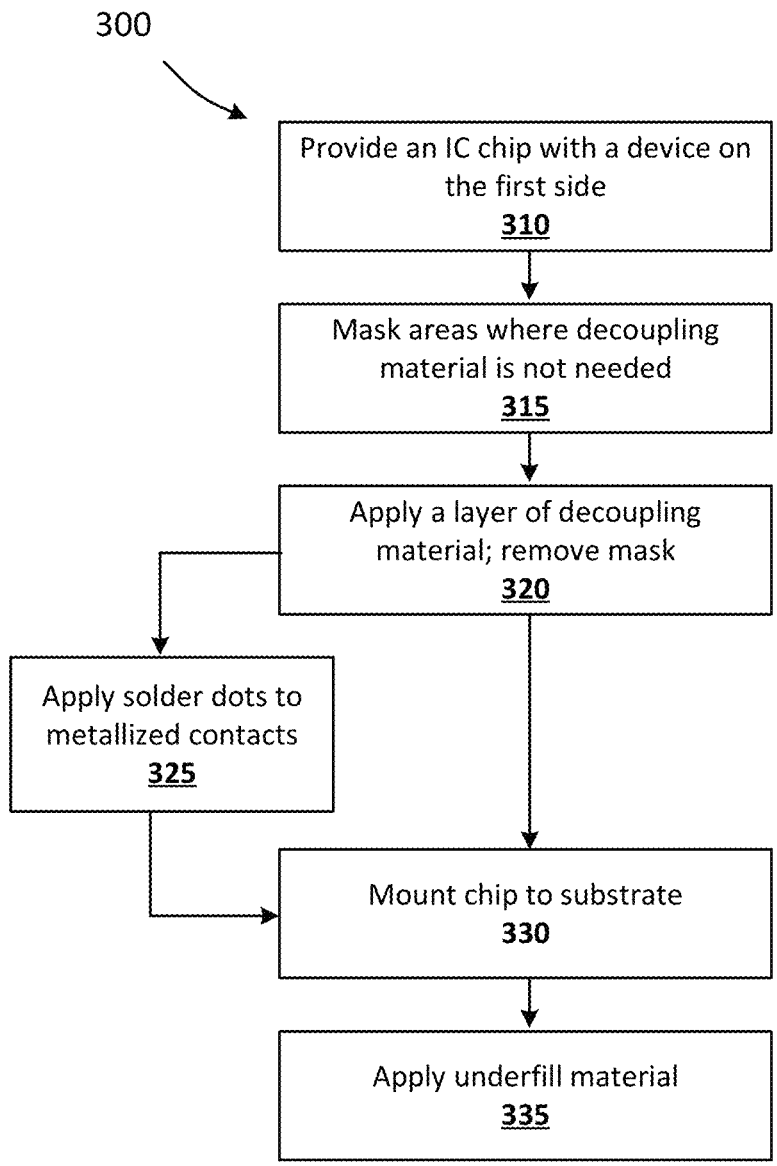
FIG. 5 illustrates a method of assembling an integrated circuit device, in accordance with embodiment of the present disclosure.

FIG. 5 illustrates a method 300 of assembling an integrated circuit device, in accordance with an embodiment of the present disclosure. FIGS. 6A-6F show examples of an integrated circuit device at various stages of processing and will be discussed concurrently with method 300 of FIG. 5.

Figure 6A:
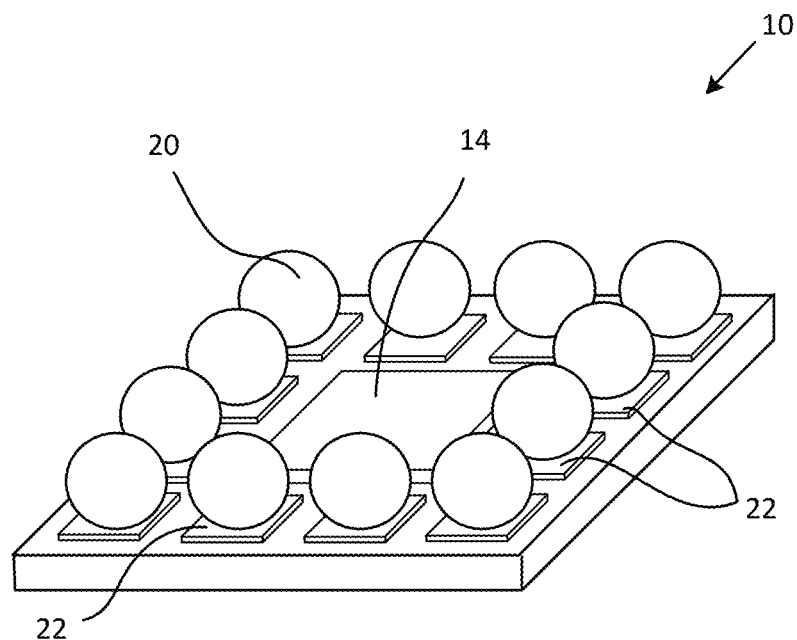
FIGS. 6A-6F illustrate a chip package at various stages of processing, in accordance with some embodiments of the present disclosure.

In accordance with one embodiment, method 300 begins with providing 310 an integrated circuit (IC) chip with at least one device on a first surface of the chip, where the chip is ready for mounting on a support, such as a package substrate or circuit board. In one example, the IC chip includes a laser diode, a light emitting diode, an optical modulator, or other semiconductor device or combination of devices. In some embodiments, providing 310 the IC chip includes processing an integrated circuit on a semiconductor wafer, metallizing contacts on the surface of the wafer, and cutting the wafer into a chip that is ready to be mounted, as will be appreciated. FIG. 6A illustrates a perspective view of an IC chip 10 that includes a device 14 surrounded by metallized contact pads 22. Solder balls 20 are on the contact pads 22.

Method 300 continues with masking 315 areas surrounding the device(s) on the chip. Masking 315 is performed using any suitable technique, such as photolithography. In some embodiments, masking 315 is performed so that the entire device area is left exposed for subsequent coating with a decoupling material. For example, the unmasked region corresponding to each device extends at least to the boundary of the device or beyond the boundary of the device. For example, the unmasked region is greater in size than the device such that it extends beyond each side of the device by at least 100 nm, such as at least 200 nm, at least 300 nm, at least 400 nm, at least 500 nm, at least 750 nm, at least 1 μm, at least 2 μm, and at least 5 μm, at least 20 μm, at least 50 μm, at least 100 μm, or at least 200 μm. The amount that the unmasked region extends beyond the boundary of the device depends on the nature of the device as well as the layout of other devices and structures on the chip, as will be appreciated. In one example embodiment, masking 315 is performed by depositing a polydimethylsiloxane (PDMS) polymer film, followed by curing or polymerizing regions of the mask that will remain on the chip by exposure to UV light, and then removing uncured regions by a solvent rinse to expose the device(s). Masking 315 optionally includes cleaning the surface of the exposed device(s) and other suitable processes as needed to prepare for subsequent processing.

In an example where solder joints exist on the chip prior to depositing the decoupling material, a mask may be used that is specifically designed to cover the solder balls and other areas that do not require the decoupling layer. One such mask has vertical walls that delineate the areas to be deposited with decoupling material.

Figure 6B:
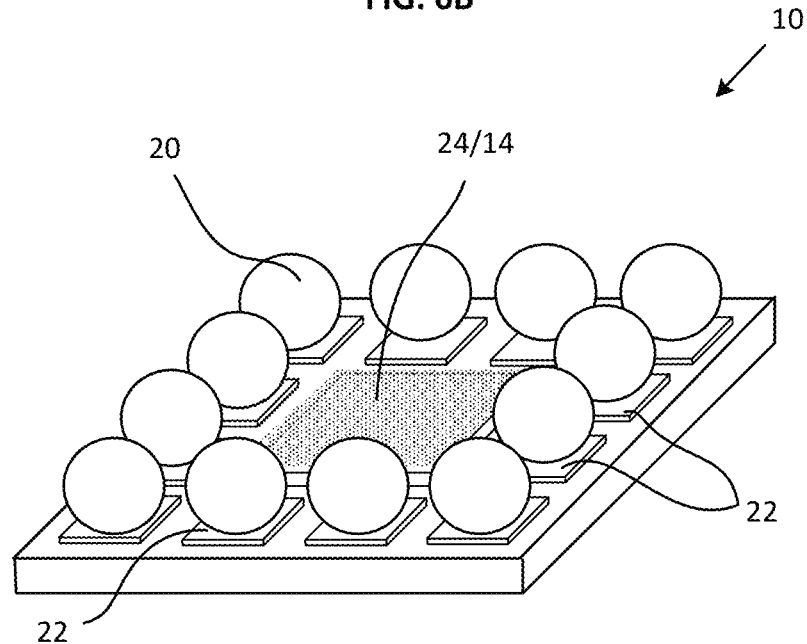

Method 300 continues with applying 320 a layer of decoupling material to the exposed device area(s). In one embodiment, applying 320 the decoupling material is performed by spray deposition, spin-coating, or other suitable deposition technique. In one example, the decoupling material can be applied to the entire chip, including the exposed device(s) and masked regions of the chip, followed by removing the mask (and decoupling material on the mask) with a suitable solvent. Examples of suitable decoupling materials include a fluorocarbon or polytetrafluoroethylene (e.g., Teflon®) non-stick dry film lubricant manufactured by DuPont, and a poly(p-xylylene) solution sold as Parylene-C. Other materials forming only weak bonds with the underfill material and mechanical compliance with the surface of the device (e.g., an oxide passivation layer) are also acceptable, as will be appreciated. The result is a layer of decoupling material covering each selected device on the chip. In some embodiments, the layer of decoupling material has a thickness from 1-15 μm, such as 1-10 μm, 1-5 μm, 2-8 μm, or 2-3 μm. FIG. 6B illustrates a perspective view of the chip 10 of FIG. 6A after applying a layer of decoupling material 24 to the device 14.

In some embodiments where solder balls 20 are not already present on the chip, method 300 continues with processing 325 solder connections. In one such embodiment, solder balls are applied to metallized contacts on the surface of the chip using any suitable techniques.

Figure 6C:
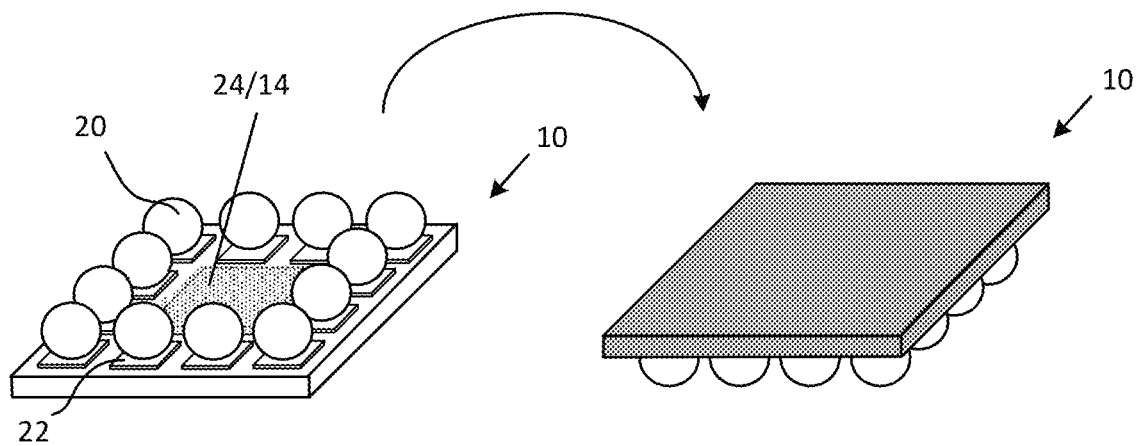
Figure 6D:
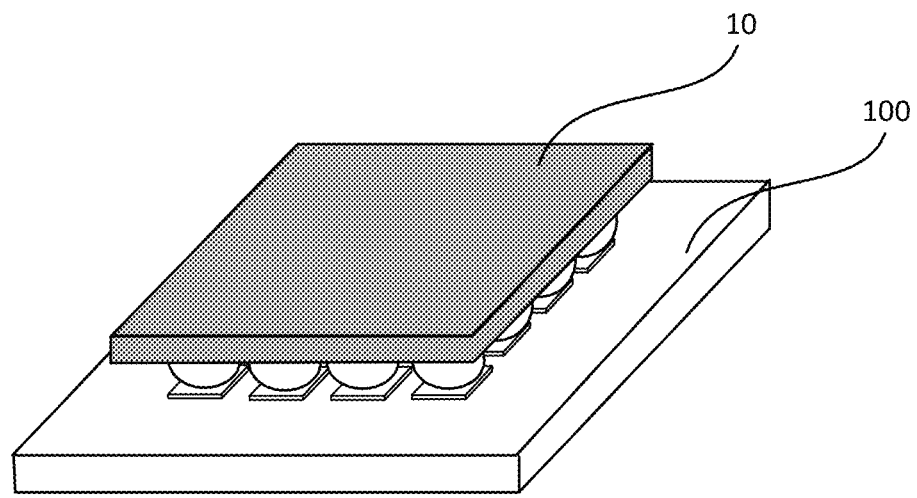

Method 300 continues with mounting 330 the chip to the support. In one example, mounting 330 the chip includes turning the chip over, aligning the solder balls with contact pads on the support, and placing the chip on the support with the solder balls in contact with contact pads on the support. The chip is then heated to reflow the solder and establish electrical connections between the chip and the support. FIG. 6C shows the chip 10 after flipping over the chip 10 in preparation for mounting to a support. FIG. 6D illustrates the chip of FIG. 6C after placing the chip 10 on the support 100 with the solder balls in contact with contact pads on the support 100 and heating the assembly to reflow the solder.

Figure 6E:
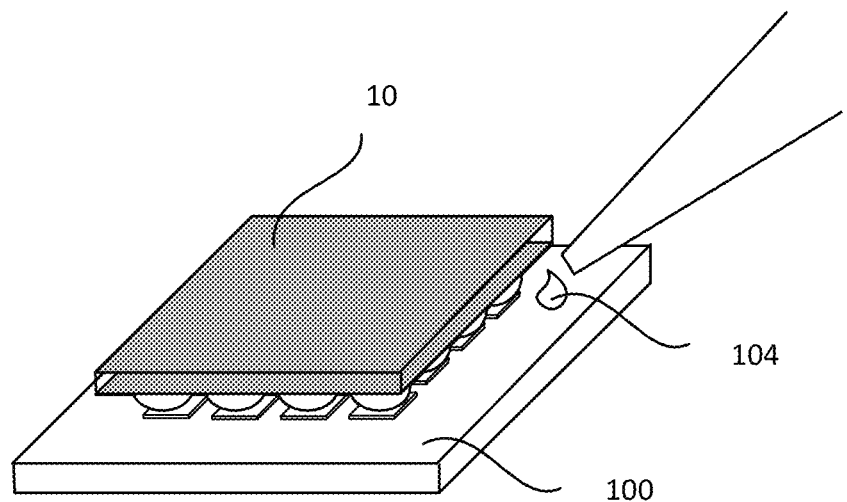
Figure 6F:
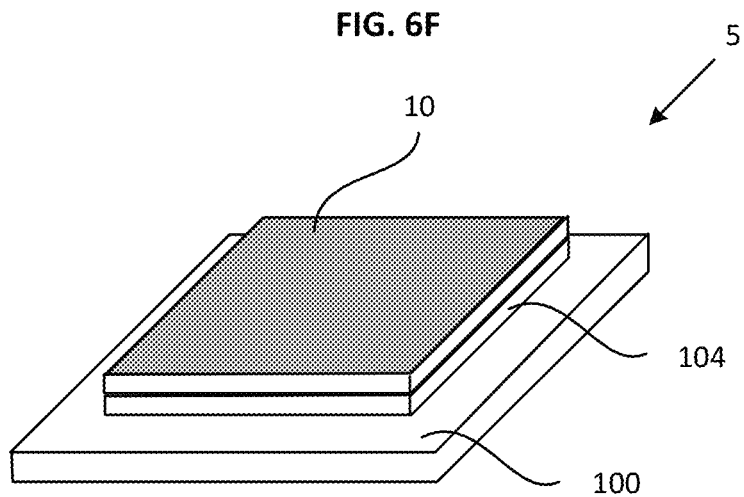

Method 300 continues with applying 335 underfill material between the chip and the substrate, followed by curing the underfill material as needed. The underfill material can be applied using any suitable techniques, such as injection. Curing may be performed by heating, exposure to air, UV light, or other methods, depending on the choice of underfill material. FIG. 6E shows the assembly of FIG. 6D during injection of underfill material 104 between the chip 10 and the support 100. FIG. 6F shows the assembly of FIG. 6E after curing the underfill material 104 and any additional finish processing needed to result in an IC chip package 5.

When a decoupling material is applied to the surface of the device(s) on a chip prior to application of underfill material, the decoupling material simulates a non-contact condition at the device surface to decouple the device from the underfill material. Since the decoupling material only forms weak bonds with the underfill material (e.g., van der Waals bonds), the device and the underfill can move independently of one another (e.g., slide, shift, contract). Accordingly, if the underfill material shrinks or changes in size or shape during operation or during the curing process, stress attributed to the underfill material is not transferred to or is minimally transferred to active material layers of the device (e.g., a quantum well of a laser diode).

Example Computing System

Figure 7:
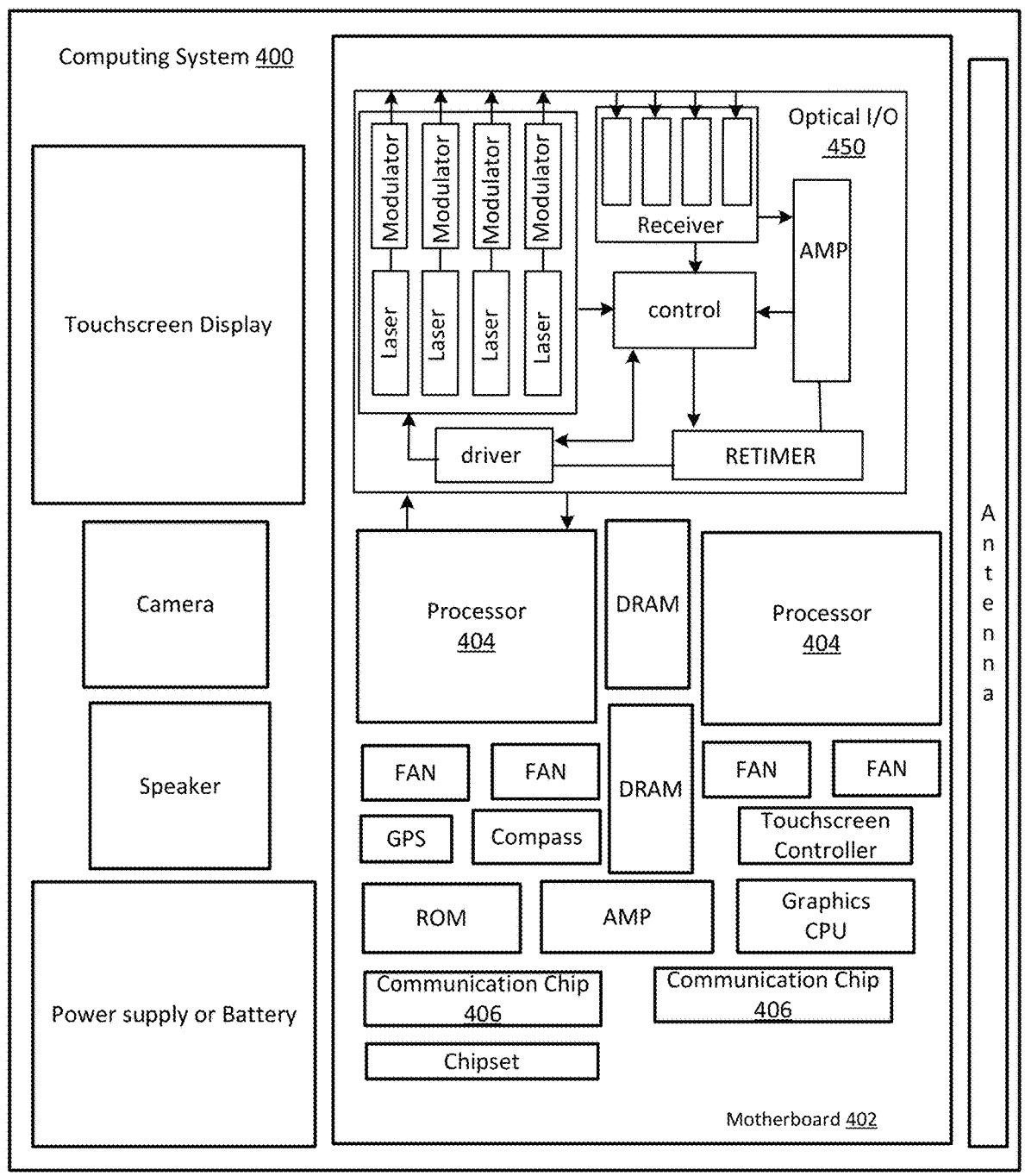
FIG. 7 illustrates a computing system utilizing one or more integrated circuit devices, in accordance with an embodiment of the present disclosure.

Referring now to FIG. 7, an example computing system 400 is shown that is implemented with one or more of the IC devices as variously disclosed herein, in accordance with some embodiments of the present disclosure. As can be seen, the computing system 400 houses a motherboard 402. The motherboard 402 may include a number of components, including, but not limited to, one or more processor 404 and at least one communication chip 406, each of which can be physically and electrically coupled to the motherboard 402, or otherwise integrated therein. As will be appreciated, the motherboard 402 may be, for example, any printed circuit board, whether a main board, a daughterboard mounted on a main board, or the only board of system 400.

Depending on its applications, computing system 400 may include one or more other components that may or may not be physically and electrically coupled to the motherboard 402. These other components may include, but are not limited to, photonics devices (e.g., components of an optical I/O device 450 (e.g., including one or more of laser diodes, modulators, transceivers, drivers, optical amplifiers, light emitting diodes, IC controllers), volatile memory (e.g., DRAM), non-volatile memory (e.g., ROM), a graphics processor, a digital signal processor, a crypto processor, a chipset, an antenna, a display, a touchscreen display, a touchscreen controller, a battery or power supply, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). In some embodiments, multiple functions can be integrated into one or more chips (e.g., note that the communication chip 406 can be part of or otherwise integrated into the processor 404).

The communication chip 406 enables wireless communications for the transfer of data to and from the computing system 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processors 404 of the computing system 400 each includes an integrated circuit die packaged within the processor 404. The term "processor" may refer to any device or portion of a device that processes, for instance, electronic data from registers and/or memory to transform that electronic data into other electronic data that may be stored in registers and/or memory.

The communication chips 406 also may each include an integrated circuit die packaged within the communication chip 406. As will be appreciated in light of this disclosure, note that multi-standard wireless capability may be integrated directly into the processor 404 (e.g., where functionality of any chips 406 is integrated into processor 404, rather than having separate communication chips). Further note that processor 404 may be a chip set having such wireless capability. In short, any number of processor 404 and/or communication chips 406 can be used. Likewise, any one chip or chip set can have multiple functions integrated therein.

In various implementations, the computing system 400 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit (IC) assembly comprising a support; a semiconductor die including a device, the semiconductor die mounted to the support with the device facing the support; a first layer comprising decoupling material on the device; and a second layer comprising an underfill material between the semiconductor die and the support, wherein the decoupling material is between the device and the underfill material and has a chemical composition that precludes covalent and ionic bonds with the underfill material.

Example 2 includes the subject matter of Example 1, wherein the device is a laser diode.

Example 3 includes the subject matter of Example 1, wherein the device is an optical modulator.

Example 4 includes the subject matter of any of Examples 1-3, wherein the semiconductor die comprises bulk silicon.

Example 5 includes the subject matter of any of Examples 1-4 and further comprises solder connections in a gap between the support and the semiconductor die, the solder connections electrically connecting the semiconductor die to the support, the solder connections at least partially encapsulated by the underfill material.

Example 6 includes the subject matter of any of Examples 1-5, wherein the decoupling material is mechanically compliant with a surface of the device.

Example 7 includes the subject matter of any of Examples 1-6, wherein the chemical composition of the decoupling material lacks terminal hydroxyl groups.

Example 8 includes the subject matter of Example 7, wherein the chemical composition of the decoupling material is selected from poly(p-xylylene) and polytetrafluoroethylene.

Example 9 includes the subject matter of Example 7, wherein the chemical composition of the decoupling material is a fluorocarbon compound.

Example 10 includes the subject matter of any of Examples 1-9, wherein the first layer has a thickness from 1 to 15 μm.

Example 11 includes the subject matter of Example 10, wherein the first layer has a thickness from 2-5 μm.

Example 12 includes the subject matter of any of Examples 10-11, wherein the first layer has a variation in thickness no greater than ±1 μm.

Example 13 includes the subject matter of any of Examples 1-12, wherein no portion of the device is uncoated by the decoupling material.

Example 14 includes the subject matter of any of Examples 1-13, wherein the support is a package substrate or a printed circuit board.

Example 15 is a printed circuit board comprising the IC assembly of any of Examples 1-14, wherein the support is a package substrate.

Example 16 in includes the subject matter of Example 15 and further comprises an optical processor.

Example 17 is an integrated circuit die comprising a support substrate; a semiconductor die including a device, the semiconductor die mounted to the package substrate with the device facing the support substrate; a layer of decoupling material on the device and absent on other regions of the die, the decoupling material having a chemical structure that lacks terminal hydroxyl groups; and an underfill material in a gap between the semiconductor die and the support substrate, wherein the decoupling material is between the device and the underfill material.

Example 18 includes the subject matter of Example 17, wherein the support substrate is one of a printed circuit board and a ceramic.

Example 19 includes the subject matter of Example 17 or 18, wherein the decoupling material is mechanically compliant with the device.

Example 20 includes the subject matter of any of Examples 17-19, wherein the decoupling material has a thickness from 1 to 15 µm.

Example 21 includes the subject matter of any of Examples 16-18, wherein the decoupling material has a thickness from 2-5 µm.

Example 22 includes the subject matter of any of Examples 17-21, wherein the decoupling material is selected from poly(p-xylylene) and polytetrafluoroethylene.

Example 23 includes the subject matter of any of Examples 17-22, wherein the device is a laser diode.

Example 24 includes the subject matter of any of Examples 17-22, wherein the device is an optical modulator.

Example 25 includes the subject matter of any of Examples 17-24, wherein the semiconductor die comprises bulk silicon.

Example 26 includes the subject matter of any of Examples 17-25 and further comprises solder connections in a gap between the support substrate and the semiconductor die, the solder connections electrically connecting the semiconductor die to the support substrate, the solder connections at least partially encapsulated by the underfill material.

Example 27 is a printed circuit board comprising the integrated circuit die of any of Examples 17-26.

Example 28 includes the subject matter of Example 27 and further comprises an optical processor.

Example 29 is a computing system comprising the printed circuit board of Example 27 or 28.

Example 30 is a method of assembling an integrated circuit package, the method comprising providing an integrated circuit die including a device and contact pads on a first side; masking the first side of the die, leaving the device exposed; applying a layer of decoupling material on the device; removing the mask; applying balls of solder on the contact pads; mounting the die to a support substrate with electrical connections between the die and the support substrate via the solder; and applying underfill material between the support substrate and the die, wherein the solder is at least partially encapsulated in the underfill material and the decoupling material is between the device and the underfill material.

Example 31 includes the subject matter of Example 30, wherein the decoupling material is selected to form only weak bonds with the underfill material and is mechanically compliant with a passivation layer on the device.

Example 32 includes the subject matter of Example 30 or 31, wherein the decoupling material has a chemical structure lacking terminal hydroxyl groups.

Example 33 includes the subject matter of any of Examples 30-32, wherein the layer of decoupling material comprises one of poly(p-xylylene) and polytetrafluoroethylene.

Example 34 includes the subject matter of any of Examples 30-33, wherein the decoupling material has a thickness from 1-15 µm.

Example 35 includes the subject matter of any of Examples 30-33, wherein the decoupling material has a thickness from 2-10 µm.

Example 36 includes the subject matter of any of Examples 30-33, wherein the decoupling material has a thickness from 1-5 µm.

Example 37 includes the subject matter of any of Examples 30-33, wherein the decoupling material has a thickness from 2-5 µm.

Example 38 includes the subject matter of any of Examples 30-37, wherein the support substrate is one of a printed circuit board and a ceramic.

Example 39 includes the subject matter of any of Examples 30-38, wherein the device is a laser diode.

Example 40 includes the subject matter of any of Examples 30-38, wherein the device is an optical modulator.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future-filed applications claiming priority to this application may claim the disclosed subject matter in a different manner and generally may include any set of one or more limitations as variously disclosed or otherwise demonstrated herein.

What is claimed is:

1. An integrated circuit (IC) assembly comprising:
   a support;
   a semiconductor die including a device, the semiconductor die mounted to the support with the device facing the support;
   a first layer comprising decoupling material on the device, the decoupling material in direct contact with the device; and
   a second layer comprising an underfill material between the semiconductor die and the support, wherein the decoupling material is between the device and the underfill material and has a chemical composition that precludes covalent and ionic bonds with the underfill material.

2. The IC assembly of claim 1, wherein the device is a laser diode.

3. The IC assembly of claim 1, wherein the device is an optical modulator.

4. The IC assembly of claim 1, wherein the semiconductor die comprises bulk silicon.

5. The IC assembly of claim 1 further comprising solder connections in a gap between the support and the semiconductor die, the solder connections electrically connecting the semiconductor die to the support, the solder connections at least partially encapsulated by the underfill material.

6. The IC assembly of claim 1, wherein the decoupling material is mechanically compliant with a surface of the device.

7. The IC assembly of claim 1, wherein the chemical composition of the decoupling material lacks terminal hydroxyl groups.

8. The IC assembly of claim 7, wherein the chemical composition of the decoupling material is selected from poly(p-xylylene) and polytetrafluoroethylene.

9. The IC assembly of claim 7, wherein the chemical composition of the decoupling material is a fluorocarbon compound.

10. The IC assembly of claim 1, wherein the first layer has a thickness from 1 to 15 µm.

11. The IC assembly of claim 10, wherein the first layer has a thickness of 2-5 µm.

12. The IC assembly of claim 10, wherein the first layer has a variation in thickness no greater than ±1 µm.

13. The IC assembly of claim 1, wherein no portion of the device is uncoated by the decoupling material.

14. The IC assembly of claim 1, wherein the support is a package substrate or a printed circuit board.

15. A printed circuit board comprising the IC assembly of claim 1, wherein the support is a package substrate.

16. The printed circuit board of claim 15, further comprising an optical processor.

17. An integrated circuit die comprising:
a support substrate; a semiconductor die including a device, the semiconductor die mounted to the package substrate with the device facing the support substrate;
a layer of decoupling material on the device and absent on other regions of the die, the decoupling material in direct contact with the device, and the decoupling material having a chemical structure that lacks terminal hydroxyl groups; and
an underfill material in a gap between the semiconductor die and the support substrate, wherein the decoupling material is between the device and the underfill material.

18. The integrated circuit die of claim 17, wherein the support substrate is one of a printed circuit board and a ceramic.

19. The integrated circuit die of claim 17, wherein the decoupling material is mechanically compliant with the device.

20. The integrated circuit die of claim 17, wherein the decoupling material has a thickness from 1 to 15 µm.

* * * * *